United States Patent
Asam

(10) Patent No.: US 10,782,334 B2
(45) Date of Patent: Sep. 22, 2020

(54) TESTING MOS POWER SWITCHES

(71) Applicant: Infineon Technologies AG, Neubiberg (DE)

(72) Inventor: Michael Asam, Sainbach (DE)

(73) Assignee: Infineon Technologies AG, Neubiberg (DE)

( * ) Notice: Subject to any disclaimer, the term of this patent is extended or adjusted under 35 U.S.C. 154(b) by 222 days.

(21) Appl. No.: 15/678,669

(22) Filed: Aug. 16, 2017

(65) Prior Publication Data

US 2019/0056448 A1    Feb. 21, 2019

(51) Int. Cl.
*G01R 31/26* (2020.01)
*G01R 31/327* (2006.01)

(52) U.S. Cl.
CPC ...... *G01R 31/2621* (2013.01); *G01R 31/3277* (2013.01)

(58) Field of Classification Search
CPC .................................................. G01R 31/2621
See application file for complete search history.

(56) References Cited

U.S. PATENT DOCUMENTS

| | | | |
|---|---|---|---|
| 6,185,488 B1 * | 2/2001 | Nomoto | B60R 21/0173 701/32.8 |
| 7,248,084 B2 | 7/2007 | Huang et al. | |
| 2004/0135201 A1 | 7/2004 | Elbanhawy | |
| 2009/0058498 A1 | 3/2009 | Udrea et al. | |
| 2012/0169377 A1 | 7/2012 | Thiele et al. | |

OTHER PUBLICATIONS

Horiguchi et al, "A fast short-circuit protection method using gate charge characteristics of SiC MOSFETs," 2015 IEEE Energy Conversion Congress and Exposition (ECCE), Montreal, QC, 2015, pp. 4759-4764, doi: 10.1109/ECCE.2015.7310332 (Year: 2015).*

Yahyaoui et al, "Switch short-circuit fault detection algorithm based on drain-to-source voltage monitoring for a fault tolerant DC/DC converter," IECON 2016—42nd Annual Conference of the IEEE Industrial Electronics Society, Florence, 2016, pp. 2212-2217, doi: 10.1109/IECON.2016.7793949 (Year: 2016).*

Anderson et al, "On-line condition monitoring for MOSFET and IGBT switches in digitally controlled drives," 2011 IEEE Energy Conversion Congress and Exposition, Phoenix, AZ, 2011, pp. 3920-3927, doi: 10.1109/ECCE.2011.6064302 (Year: 2011).*

U.S. Appl. No. 15/192,523, by Andreas Meiser, filed Jun. 24, 2016.

* cited by examiner

*Primary Examiner* — Clayton E. LaBalle
*Assistant Examiner* — Leon W Rhodes, Jr.
(74) *Attorney, Agent, or Firm* — Shumaker & Sieffert, P.A

(57) ABSTRACT

Methods and devices are discussed relating to testing of MOS switch transistors. For example, at least two different test measurements may be performed, and a fault state may be determined based on the at least two test measurements.

14 Claims, 9 Drawing Sheets

TESTING MOS POWER SWITCHES

TECHNICAL FIELD

The present application relates to devices and methods related to testing of switch devices including MOS (metal oxide semiconductor) switch transistors.

BACKGROUND

In many applications, MOS transistors are nowadays used as power switches for selectively coupling a load to a power supply, for example in automotive applications. Depending on their design, such MOS transistors may be able to switch high voltages (hundreds of volts or more) and/or high currents, for example 10 A or more. For controlling such switches, gate driver circuits are provided, usually in the form of an integrated circuit (IC). Such gate driver circuits control a gate terminal of the MOS transistor. Furthermore, these gate driver circuits may provide protective functions like overcurrent protection, for example by switching the transistor off if a current flowing via the transistors exceeds a threshold.

In safety critical environments, for example automotive environments, functional safety requirements have to be fulfilled. For example, it may be required that fault states of a switch device including a MOS switch transistor may be detected. Such faults include for example faulty connections to the MOS transistor (faulty gate connections, faulty drain connections and/or faulty source connections), short circuits between transistor terminals or a fault in a shunt transistor used for measuring a current through the transistor. In such safety critical environments, it may be required to not only be able to detect that a fault is present, but to also detect type and location of the fault to be able to react accordingly.

SUMMARY

According to an embodiment, a method is provided, comprising:
performing at least two test measurements on a switch device, the switch device comprising at least one switch transistor, wherein the at least two test measurements are selected from the group consisting of:
  determining a measure of a gate capacitance of the at least one switch transistor,
  determining a measure of a drain-source voltage of the at least one switch transistor,
  determining a measure of a source voltage of the at least one switch transistor,
  testing a shunt resistor of the transistor switch device, and
  determining a measure of a voltage drop across the shunt resistor, and
determining a fault state of the transistor switch device based on the at least two test measurements.

According to another embodiment, a method is provided, comprising:
applying a test current to a switch device comprising at least one switch transistor, the test current having a magnitude selected essentially not to disturb normal operation of the switch device,
measuring a voltage in response to the test current, and
determining a fault state of the switch device based on the measured voltage.

According to another embodiment, a method is provided, comprising:
determining a drain-source voltage of at least one switch transistor,
determining a voltage across a shunt resistor coupled to the at least one switch transistor, and
evaluating a ratio between the drain-source voltage and the voltage across the shunt resistor.

According to another embodiment, a device is provided, comprising:
a test current generator configured to apply a test current to a switch device comprising at least one switch transistor, the test current having a magnitude selected essentially not to disturb normal operation of the switch device,
a voltage measurement circuit configured to measure a voltage in response to the test current, and
an evaluation circuit configured to determine a fault state of the switch device based on the measured voltage.

According to yet another embodiment, a device is provided, comprising:
a measurement circuit configured to determine a drain-source voltage of at least one switch transistor, and to determine a voltage across a shunt resistor coupled to the at least one switch transistor, and
an evaluation circuit configured to evaluate a ratio between the drain-source voltage and the voltage across the shunt resistor.

The above summary is merely intended to give a brief overview over some features of some embodiments and is not to be construed as limiting.

DETAILED DESCRIPTION

Figure 1:
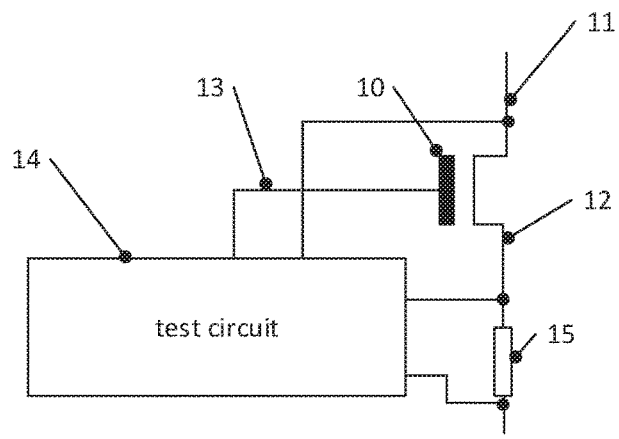
FIG. 1 is a schematic diagram of a switch device according to an embodiment.

In the following, various embodiments will be described in detail referring to the attached drawings. It should be noted that these embodiments are given for illustrative purposes only and are not to be construed as limiting. For example, while embodiments may be described as comprising a plurality of features or elements, in other embodiments, some of these features or elements may be omitted and/or may be replaced by alternative features or elements. Furthermore, in addition to the features explicitly shown and described, other features or elements, for example features or elements used in conventional switch devices including switch transistors like MOS switch transistors, may be provided.

Features or elements from different embodiments may be combined to form further embodiments. Variations and modifications described with respect to one of the embodiments are also applicable to other embodiments.

In the embodiments shown and described, any direct electrical connection or coupling between elements, i.e. a connection or coupling without intervening elements like a simple metal trace, may be replaced by an indirect connection or coupling, i.e. connection or coupling comprising one or more additional intervening elements, and vice versa, as long as the general purpose of the connection or coupling, for example to transmit a certain kind of signal, to transmit a certain kind of information and/or to provide a certain kind of control, is essentially maintained. In other words, connections or couplings shown and described may be modified as long as the general purpose of the connection or coupling is essentially maintained.

In the figures, similar or corresponding elements in different figures bear the same reference numerals and will not be described in detail repetitively.

While MOS switch transistors are used in the following as examples, in other embodiments other kinds of field effect transistors (FETs) or also insulated gate bipolar transistors (IGBTs) may be used. The terms "source" and "drain" as used herein are to cover also emitter and collector of such IGBTs.

Turning now to the figures, FIG. 1 schematically illustrates a switch device according to an embodiment. The device of FIG. 1 comprises a MOS switch transistor 10 including a gate terminal 13, a drain terminal 11 and a source terminal 12. While a single transistor 10 is shown in FIG. 1, in other embodiments, a plurality of transistors coupled in parallel, i.e. with their respective source terminals connected to each other and their respective drain terminals connected to each other, may be provided in order to decrease a resistance when the transistor is on. Any reference to a switch transistor made herein is intended to also cover the case of two or more of such transistors coupled in parallel.

A MOS transistor is referred to as being on, in an on-state or closed herein when it provides a low ohmic connection between its source and drain terminals. The transistor is referred to as off, in an off-state or open when it is essentially electrically isolating (apart possibly from undesired leakage currents) between its source and drain terminals.

Transistor 10 may be an NMOS transistor or PMOS transistor, depending on the implementation. Transistor 10 may be used to selectively couple a load to a supply voltage, for example in automotive applications.

Furthermore, the device of FIG. 1 comprises a shunt resistor 15 coupled to source terminal 12. Shunt resistor 15 is a very low ohmic resistor, with a resistance below 1Ω, in particular below 100 mΩ or below 1 mΩ, i.e. in the microohm (μΩ) range, and a voltage drop across shunt resistor 15 may be measured in order to measure a load current, i.e. a current flowing via transistor 10 between drain terminal 11 and source terminal 12 when transistor 10 is on.

The device of FIG. 1 further comprises a test circuit 14 to test functioning and connection of the device of FIG. 1. For example, as will be discussed herein further below in greater detail, test circuit 14 may test electrical connections to gate terminal 13, drain terminal 11, source terminal 12 and/or to shunt resistor 15. While in some embodiments all of these and possibly other properties of the device of FIG. 1 may be tested, in other embodiments only a subset of these properties, or only one of these properties may be tested. In embodiments, various measurements are performed by test circuit 14 to test the properties. Details will be discussed further below using specific non-limiting examples. Test circuit 14 may also provide gate driver functionality to transistor 10. In other words, test circuit 14 may be integrated with a gate driver circuit to both drive and test transistor 10.

Figure 2:
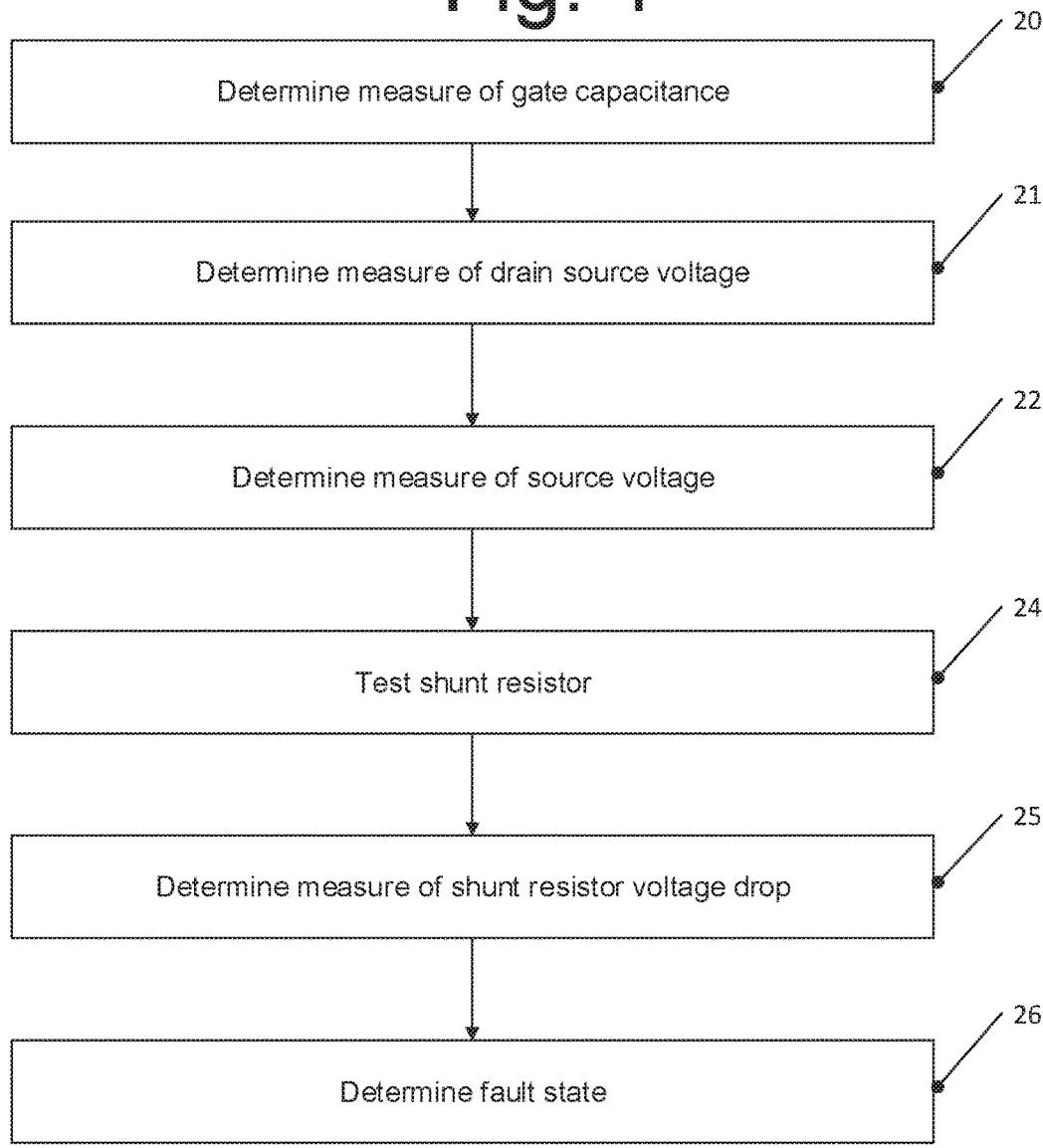
FIG. 2 is a flowchart illustrating a method according to an embodiment.

FIG. 2 illustrates a method according to an embodiment. The method of FIG. 2 may be implemented by test circuit 14 of FIG. 1 and will be described referring to FIG. 1 for ease of understanding, but is not limited thereto. While the method of FIG. 2 is depicted as a series of acts or events, the order in which these acts or events are described is not to be construed as limiting. In particular, acts or events may be performed in a different order than shown, or some of the acts or events may be performed in parallel, for example using different parts of a test circuit to perform measurements in parallel. Moreover, while referring to reference numerals 20-25 a plurality of different test measurements are described, in other embodiments, only some of these measurements or only one of these measurements may be performed.

At 20, the method of FIG. 2 comprises determining a measure of a gate capacitance of a MOS transistor like MOS transistor 10 or a plurality of MOS transistors coupled in parallel, as indicated above. "A measure of", as used herein, refers to any value or other information which gives information about the magnitude of a quantity, in this case a magnitude of a gate capacitance. Such a measure, in case of a gate capacitance, may for example be the value of the capacitance (given for example in Farad), but may also be another value indicative of the capacitance. For example, as explained below in more detail, instead of giving a value of the capacitance directly, also a time duration may be given which is needed to charge the gate capacitance to a predefined voltage with a given charging current, or by a voltage reached after a predefined time when charging/discharging the capacitance. In case of a voltage, the measure may be the voltage given in volts, but may also be an indirect quantity, for example a current which flows when the voltage is applied to a predefined resistor. Conversely, a current may be measured using a voltage drop across a predefined resistor when a current flows. In other embodiments, the measure may be an indicator if the quantity exceeds a predefined threshold or is below a predefined threshold. Therefore, for many quantities, there is a plurality of ways to indicate the quantity directly or indirectly, and the term "measure of" is intended to cover variations.

The gate capacitance, as will be explained further below with respect to reference numeral 26 may be indicative of fault states of a connection to the gate (for example gate of transistor 10) and/or of faults in current sources or other devices for charging/discharging the gate.

At 21, the method comprises determining a measure of a drain-source voltage, for example a voltage across transistor 10. At 22, the method comprises determining a measure of a source voltage, e.g. a voltage at source terminal 12 of transistor 10 (measured for example taking ground as a reference). The drain-source voltage and/or source voltage may be used for example to determine a short circuit between drain and source and/or may be used to determine an external short circuit.

At 24, the method comprises testing of connections to a shunt resistor (e.g. shunt resistor 15) to ensure that the shunt resistor is connected correctly. At 25, the method comprises determining a measure of a voltage drop across the shunt resistor, for example shunt resistor 15 of FIG. 1. A ratio of the drain-source voltage determined at 21 and the voltage drop across the shunt resistor may be indicative of faults and/or aging, as also will be explained further below.

At 26, the results of the test measurements at 20-25 are used to determine a fault state of the switch device, if such a fault state is present. An overview of various fault states which may be identified when the test measurements at 20-25 are made in a state where the transistor is off are given in the table below, also referred to as first table herein:

| | Gate impedance too | | $V_{DS}/V_{shunt}$ too | | $V_{source}$ too | | Shunt resistor test |
|---|---|---|---|---|---|---|---|
| | high | low | high | low | high | low | |
| MOS transistor terminal open | X | | | | | | |
| Gate short circuit | | X | | | (X) | | |
| Drain-source short circuit | | | | X | X | | |
| Shunt open | | | | | | | X |
| Shunt connections open | | | | | | | X |
| Gate charging circuit fault | | X | | | | | |
| External short circuit | | | | | X | | |

In the above first table, $V_{DS}$ is the drain-source voltage determined at 21, $V_{shunt}$ is the voltage drop across the shunt resistor determined at 25, $V_{source}$ is the source voltage determined at 22. The columns of the above table reflect the test measurements at 20-25 in FIG. 2 and the lines of the table relate to various fault states. "too high" and "too low" may be evaluated by comparing with a respective predefined threshold, where different or same thresholds may be used for different fault states. MOS terminal open may refer to a disconnected gate terminal, drain terminal or source terminal. Gate short circuit relates to a short circuited gate. Shunt open essentially relates to the shunt resistor 15 "missing", and shunt terminals open relates to the connections to the shunt resistor being disconnected.

An "X" in the above first table indicates that when the respective condition of the column applies, the respective fault state is indicated. For example, if the gate impedance is too high (higher than a predefined value) transistor 10 may be disconnected or at least one of the transistors may be disconnected in case of a plurality of parallel transistors. An "X" in parenthesis indicates a secondary indication. For example, a low gate impedance may indicate both a gate short circuit and a fault in a gate charging device. However, in the former case additionally the source voltage may be above a respective predefined value.

In this way, as can be seen by combining different determinations or tests, different fault states may be clearly distinguished.

The table below, also referred to as second table, gives an overview over determination of fault states if the test measurements at 20-25 are made when the transistor is on.

| | Gate impedance too | | $V_{DS}/V_{shunt}$ too | | $V_{source}$ too | | Shunt resistor test |
|---|---|---|---|---|---|---|---|
| | high | low | high | low | high | low | |
| MOS transistor terminal open | X | | X | | | | |
| Gate short circuit | | X | | | (X) | | |
| Drain-source short circuit | | | | | X | | |
| Shunt short circuit | | | X | | | | |
| Shunt open | | | X ($V_{shunt} = V_{bat}$) | | | | |
| Shunt connections open | | | | | | | X |
| Gate discharging circuit fault | | X | | | | | |

In the above table, $V_{bat}$ is a supply voltage to which the transistor selectively couples a load. In this case, an open shunt may be indicated when the voltage $V_{shunt}$ determined at 25 corresponds to this battery voltage. Also here, a plurality of measurements may be combined to distinguish between different faults. For example, as indicated in the above table, a shunt short circuit is indicated by the ratio $V_{DS}/V_{shunt}$ being higher than a predefined (expected) value. However, such a wrong ratio could also be determined caused by an open drain terminal of the transistor. However, an open drain terminal may be ruled out if the gate impedance is correct (neither too high nor too low). Otherwise, the explanations given for the first table also apply to the second table.

When faults are detected according to the above tables, appropriate measures may be taken by a system incorporating the MOS switch transistor. For example, if only one of the transistors is defective in case of a plurality of transistors coupled in parallel, the other transistor may be used to at least bring the system to a safe state, for example to bring an automobile to a controlled stop in case of autonomous driving applications. The measures to be taken may depend on the system and the type of fault.

After the above overview of various measurements performed and their evaluation, in the following examples for such determinations and tests will be discussed in more detail.

Figure 3:
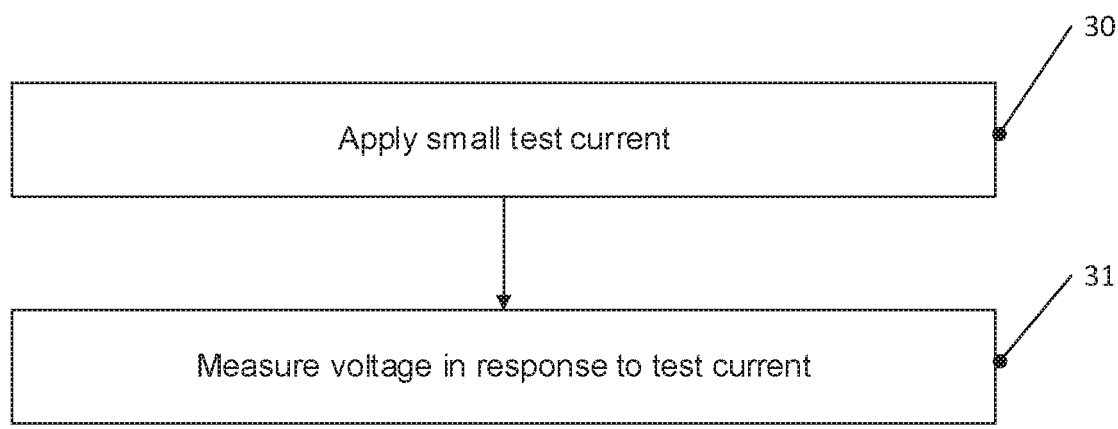
FIG. 3 is a flowchart illustrating a method according to a further embodiment.

FIG. 3 is a flowchart of a method according to an embodiment, which may be used for example for determining a measure of the gate capacitance at 20 in FIG. 2 or testing a shunt resistor at 24 of FIG. 2, but may also be used independently therefrom. At 30 in FIG. 3, the method comprises applying a small test current to a switch device. A small test current, as used herein, is a test current which essentially does not affect normal operation of the switch device, such that the test may be performed during normal operation of the device. For example, if the test current is a test current for charging or discharging a gate of a MOS transistor of the switch device like transistor 10, the magnitude and/or duration of the test current is such that the switch state of the transistor (off or on) is not altered, or, in other words, a threshold voltage of the transistor is not crossed in response to the test current. If the test current is for example applied to a shunt resistor like shunt resistor 15, a magnitude of the test current is less than 10%, for example less than 1% or less, of a load current flowing via the transistor, such that the load current is not significantly altered by the test current.

At 31, a voltage at the switch device is measured in response to the current, for example a gate-source voltage in case of a gate capacitance test or a voltage across the shunt resistor in case of testing the shunt resistor. In this way, a measure of the gate capacitance and/or a testing of a shunt resistor may be performed during normal operation of the switch device in some embodiments.

To further illustrate the method of FIG. 3, next referring to FIGS. 4-7 application of the method of FIG. 3 to determining a measure of the gate capacitance, for example at 20 in FIG. 2, will be discussed.

Figure 4:
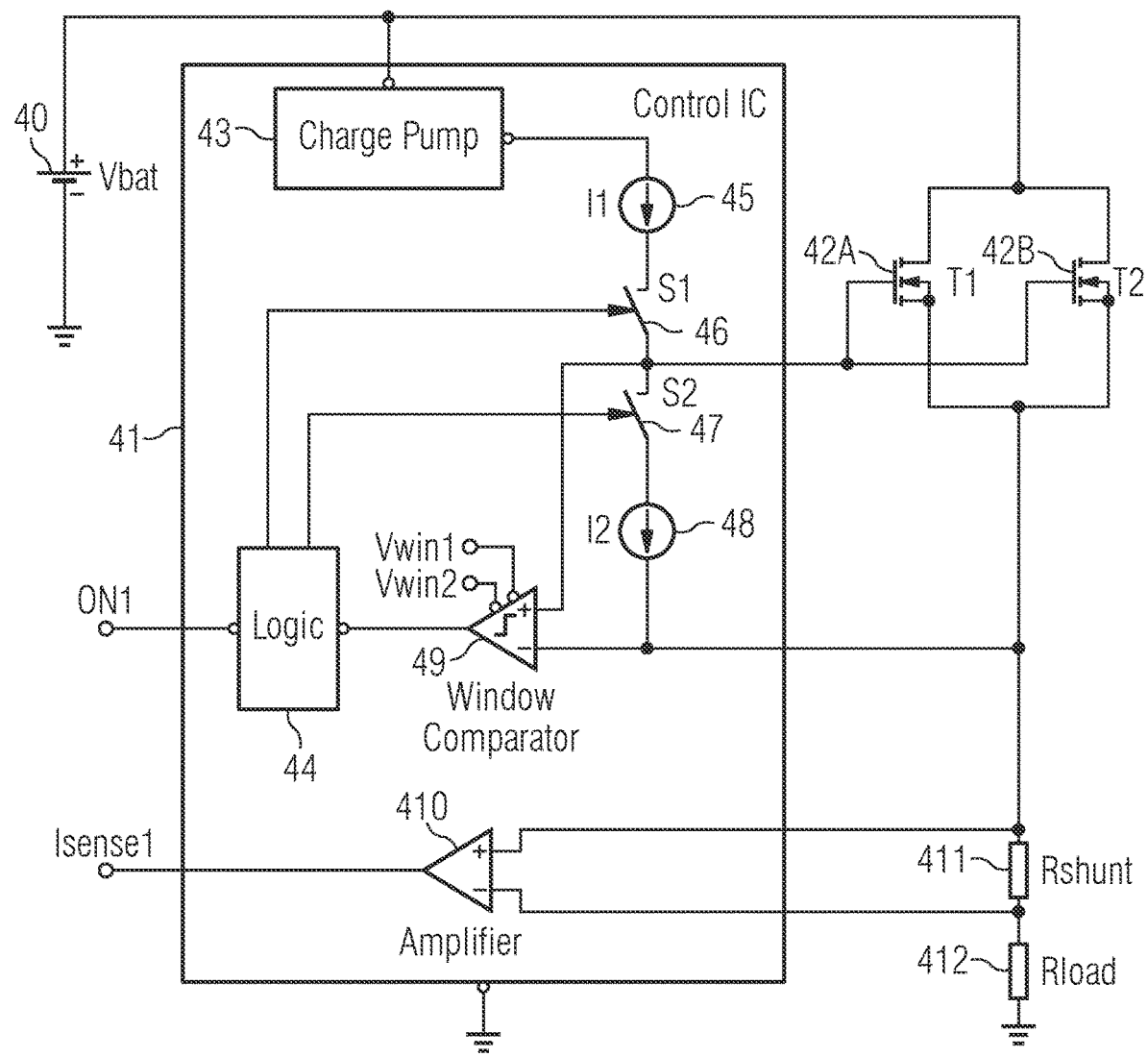
FIG. 4 is a circuit diagram of a device according to an embodiment.

FIG. 4 is a circuit diagram of a switch device according to an embodiment. The switch device of FIG. 4 comprises two transistors 42A, 42B coupled in parallel. Transistors 42A, 42B in operation are used to selectively couple a voltage source 40 providing a voltage $V_{bat1}$ to a load 412 represented by a resistor in FIG. 4.

The number of two transistors 42A, 42B serves merely as an example, and in other embodiments only a single transistor or more than two transistors coupled in parallel may be provided.

The embodiment of FIG. 4 comprises a control circuit 41, which may be provided in the form of an integrated circuit and which serves for controlling the gates of transistors 42A, 42B, and for performing tests as will be discussed below in more detail.

A charge pump 43 is provided to generate a voltage based on voltage $V_{bat1}$ for driving gate terminals of transistors 42A, 42B. For controlling gates of transistors 42A and 42B (collectively referred to as transistors 42 in the following), a first switch 46 and a second switch 47 are provided. When first switch 46 is closed, as symbolized by a current source 45 a charging current $I_1$ flows charging gate terminals of transistors 42, thus turning transistors 42 on. When switch 46 is open and second switch 47 is closed, as symbolized by a current source 48, a discharging current $I_2$ flows discharging the gate terminals of transistors 42, thus turning transistors 42 off. Switches 46, 47 are controlled by a logic circuit 44 depending on a signal ON1. Via signal ON1, a system where the switch device of FIG. 4 is incorporated may signal that transistors 42 are to be turned on or off.

Furthermore, the device of FIG. 4 comprises a shunt resistor 411 coupled between transistors 42 and load 412. As explained with reference to FIG. 1 for shunt resistor 15, shunt resistor 411 may have a low resistance value, for example below 1Ω, in particular below 1 mΩ. First and second terminals of shunt resistor 411 are coupled to positive and negative inputs of a differential amplifier 410, respectively, which outputs a value $I_{Sense1}$ corresponding to a voltage drop across shunt resistor 411. This voltage drop is a measure of a load current flowing from voltage supply 40 via transistors 42 to load 412.

For determining a measure of a gate capacitance in a state where transistors 42 are off, logic 44 temporarily closes switch 46 to slightly charge the gates of transistors 42 with current $I_1$. The time during which transistor 46 is closed is so short that transistors 42 are not turned on, i.e. the gate-source voltage of transistors 42 does not exceed the threshold voltage of transistors 42.

Conversely, in a state where the transistors 42 are turned on, for determining a measure of a gate capacitance switch 47 is temporarily closed to slightly discharge gate terminals of transistors 42. The time during which switch 47 is closed is selected such that transistors 42 are not turned off, or, in other words, that the gate-source voltage does not fall below the threshold voltage.

During this measurement, the gate-source voltage of transistors 42 is measured by a window comparator 49. Gate terminals of transistors 42 are coupled to a positive input of window comparator 49, and source terminals of transistors 42 are coupled to a negative input of window comparator 49. Voltages $V_{win1}$, $V_{win2}$ determine a "window" for window comparator 49. Therefore, window comparator 49 determines if the voltage difference between its positive and negative inputs, in this case corresponding to the gate-source voltage of transistors 42, is between $V_{win1}$ and $V_{win2}$. Based on this determination, a measure of the gate capacitance may be obtained, as will now be illustrated referring to FIGS. 5A and 5B.

Figure 5A:
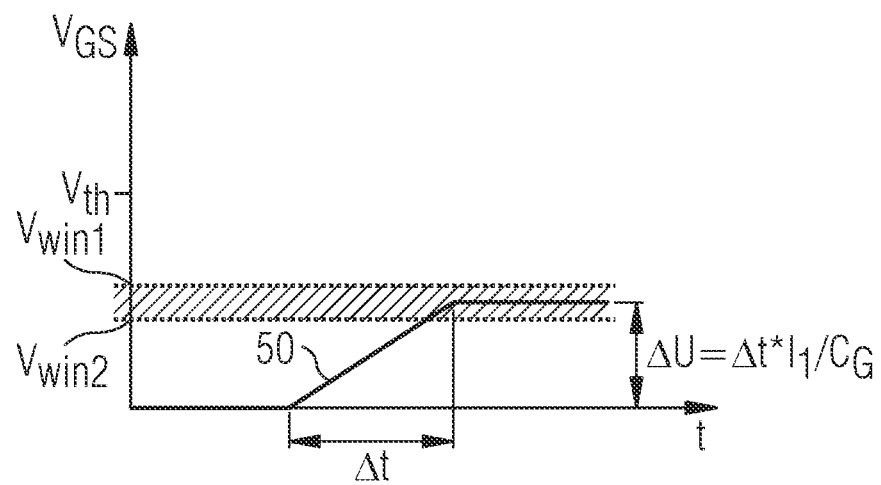
FIGS. 5A and 5B are schematic signal diagrams for illustrating a measurement according to some embodiments.

FIG. 5A illustrates an example measurement performed with the device of FIG. 4 in a state where transistors 42 are off. In the example of FIG. 5A, switch 46 is closed for a time $\Delta t$, such that the gate voltage rises as illustrated by a curve 50. The voltage difference $\Delta U = \Delta t \cdot I_1 / C_G$, where $I_1$ is the charging current and $C_G$ is the gate capacitance, in the example of FIG. 4 the combined gate capacitance of transistors 42.

In some embodiments, the time duration $\Delta t$ may be selected such that switch 46 remains closed until the gate source voltage is between $V_{win1}$ and $V_{win2}$, as detected by window comparator 49. If both transistors 40A, 40B are connected correctly, a certain expected $\Delta t$ results corresponding to the gate capacitance according to the equation above. In case for example one of the two transistors 42A, 42B has its gate disconnected, the effective gate capacitance $C_G$ is only half the gate capacitance of both transistors, which approximately corresponds to a $\Delta t$ being about half the expected value. In case both transistors 42 are disconnected, the effective gate capacitance is very low (as no gate capacitance is connected), which causes a very fast rise of the voltage and a very small $\Delta t$. On the other hand, if for example charge pump 43 is malfunctioning such that $I_1$ is lower than it should be or even zero, $\Delta t$ is longer than the expected value, or the voltage between $V_{win1}$ and $V_{win2}$ may never be reached in case $I_1$ is equal to zero (complete malfunction of charge pump or switch 46). Therefore, by evaluating the time needed for the gate-source voltage to reach a level between $V_{win1}$ and $V_{win2}$, various fault states may be detected and distinguished from each other, in particular disconnected gate terminals and malfunctioning of gate current supply. Another fault besides a disconnected gate may also a be a defective gate oxide, which also changes the gate capacitance.

Measuring the time $\Delta t$ may be done internally in circuit 41 using an oscillator. Alternatively, the measurement may be performed by a microcontroller, and logic 44 may forward the output of window comparator 49 to such a microcontroller via a bus or other connection.

It should be noted that instead of evaluating the time $\Delta t$ until the voltage reaches a value between $V_{win1}$ and $V_{win2}$, in other embodiments $I_1$ may be applied for a fixed time $\Delta t$, and the resulting voltage $\Delta U$ after this time may be evaluated. In other embodiments, the slope of curve 50 (e.g. $\Delta U/\Delta t$) may be evaluated. All these measures give the same information regarding the gate capacitance $C_G$ and possible fault states.

As can be seen from FIG. 5A, $V_{win1}$ and $V_{win2}$ are below a threshold voltage $V_{th}$ of transistors 42 such that the transistors remain off during the testing, and the testing does not influence operation of the device shown in FIG. 4.

Figure 5B:
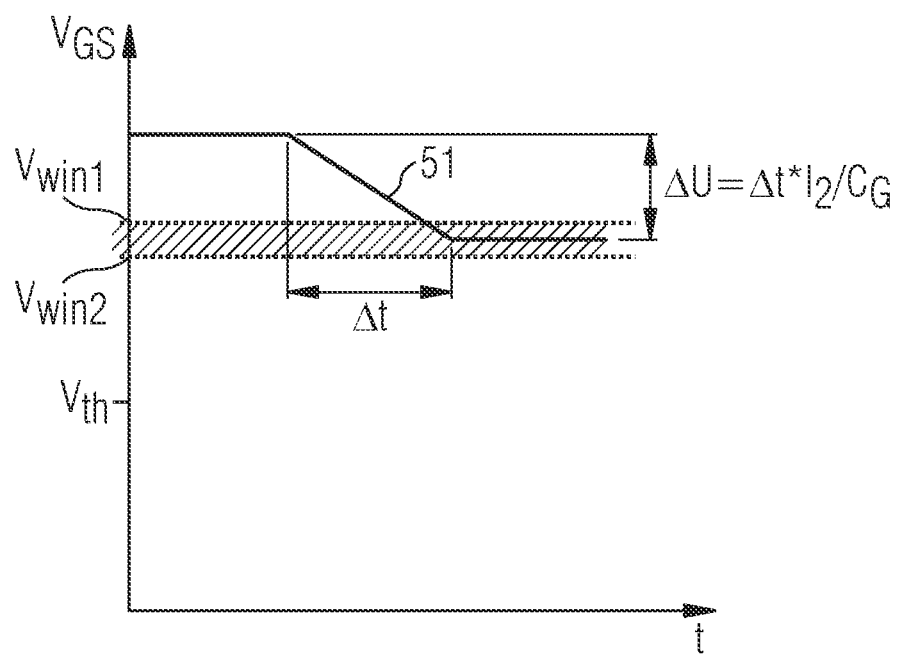

FIG. 5B illustrates the measurement for the case where the transistors 42 are turned on. In this case, the discharging current I2 slightly discharges the gate, as illustrated by a curve 51 in FIG. 5B. The discharge is selected such that the gate-source voltage remains above the threshold voltage Vth, such that the transistors 42 remain turned on. The voltage difference ΔU for a discharging of the gate during a time Δt is ΔU=Δt·I2/CG.

Similar to what has been discussed referring to FIG. 5A, the time Δt necessary for the gate-source voltage to reach a value between $V_{win1}$ and $V_{win2}$ (which in this case are above the threshold voltage $V_{th}$) may be measured, or a gate-source voltage reached after a predefined discharge time Δt may be measured, or the slope of curve 51 may be measured, which all give information regarding whether transistors 42 are connected and if the gate discharging works properly (for example switch 47 is working correctly) may be obtained, similar to what was explained already with respect to FIG. 5A for the case where the transistor is off.

Figure 6:
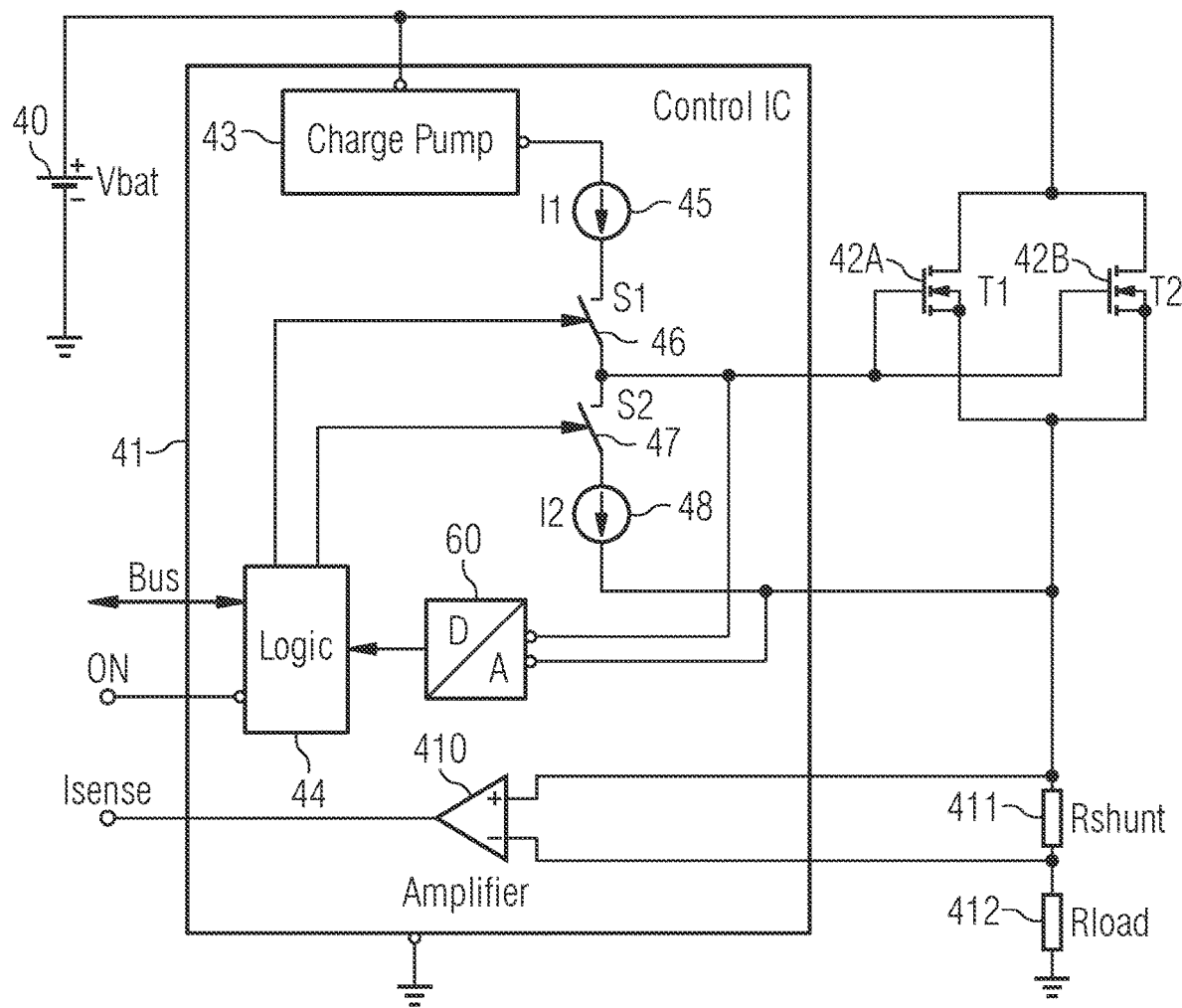
FIG. 6 is a circuit diagram illustrating a switch device according to an embodiment.

FIG. 6 illustrates a switch device according to an embodiment which is a variation of the switch device of FIG. 4.

In FIG. 6, compared to FIG. 4 instead of window comparator 49, a digital to analog converter (DAC) 60 is provided. Inputs of digital to analog converter 60 are coupled to gate terminals of transistors 42 and source terminals of transistors 42 as shown, such that digital to analog converter 60 outputs a digital representation of the gate-source voltage of transistors 42. Measurements may be performed as explained with reference to FIGS. 4 and 5, i.e. in an off-state of the transistors 42, switch 46 may be temporarily closed, and in an on-state, switch 47 may be temporarily closed as shown. The gate-source voltage may then be evaluated in logic circuit 44, for example compared with threshold values corresponding to voltages $V_{win1}$ and $V_{win2}$ of FIGS. 5A and 5B. Therefore, in contrast to FIG. 4, the comparison to threshold voltages is not performed using a window comparator 49, but is performed on a digital representation of the gate-source voltage. In other embodiments, measured values may be output e.g. via a bus and evaluated externally, for example in a microcontroller. Otherwise, the comments made with respect to FIGS. 4 and 5 also apply to the embodiment of FIG. 6.

Figure 7:
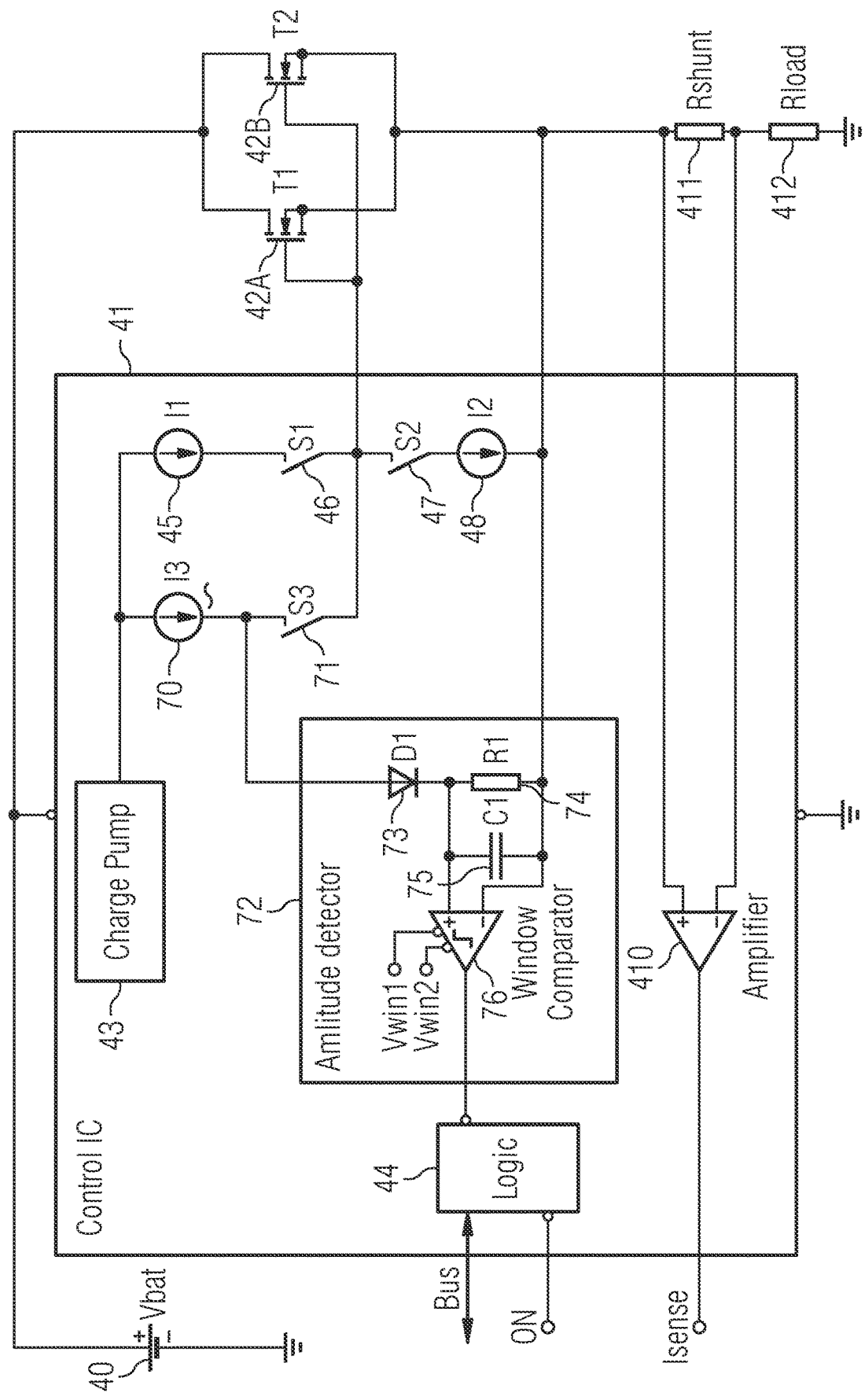
FIG. 7 is a circuit diagram illustrating a switch device according to an embodiment.

Instead of charging or discharging the gate with a constant current, in other embodiments, an impedance related to the gate capacitance may be measured by applying an alternating current (AC) signal to the gate terminal. A corresponding embodiment is illustrated in FIG. 7. Again, components already discussed with reference to previous embodiments bear the same reference numerals and will not be discussed again in detail.

In the embodiment of FIG. 7, an AC current source 70 supplied by charge pump 43 is provided. When a switch 71 is closed, a corresponding AC current $I_4$ is applied to gate terminals of transistors 42A, 42B. This AC current $I_4$ is again a small current in the sense explained above, i.e. the magnitude is such that the charging and discharging of the gate terminals of transistors 42 caused by this AC current does not change the switching state (on or off) of transistors 42.

An amplitude detector 72 measures an amplitude of the gate-source voltage of transistors 42A, 42B in response to this AC current.

Amplitude detector 72 comprises a diode 73 for rectification and a parallel circuit of a resistor 74 and a capacitor 75 serving as a smoothing filter. The thus rectified and filtered gate voltage is provided to a window comparator 76, which evaluates if the amplitude is in an expected range between a first voltage $V_{win1}$ and a second voltage $V_{win2}$. If the amplitude is outside this expected range, this may indicate fault as discussed above.

In other words, when the amplitude is in the expected range, this indicates that the gate capacitance is in the expected range, as the ratio between current generated by current source 70 and applied to the gate terminals and the measured amplitude depends on the gate impedance and therefore gate capacitance. If the amplitude is in the expected range defined by $V_{win1}$ and $V_{win2}$, this shows that gate, drain and source terminals of transistors 42 are connected and that the gate oxide of transistors 42 is not defective (as this would change the capacitance and therefore the impedance).

Next, referring to FIG. 8, an example of an application of the method of FIG. 3 for testing a shunt resistor will be discussed. The embodiment of FIG. 8 is based on the previously discussed embodiments, and like elements again bear the same reference numerals and will not be described again.

Figure 8:
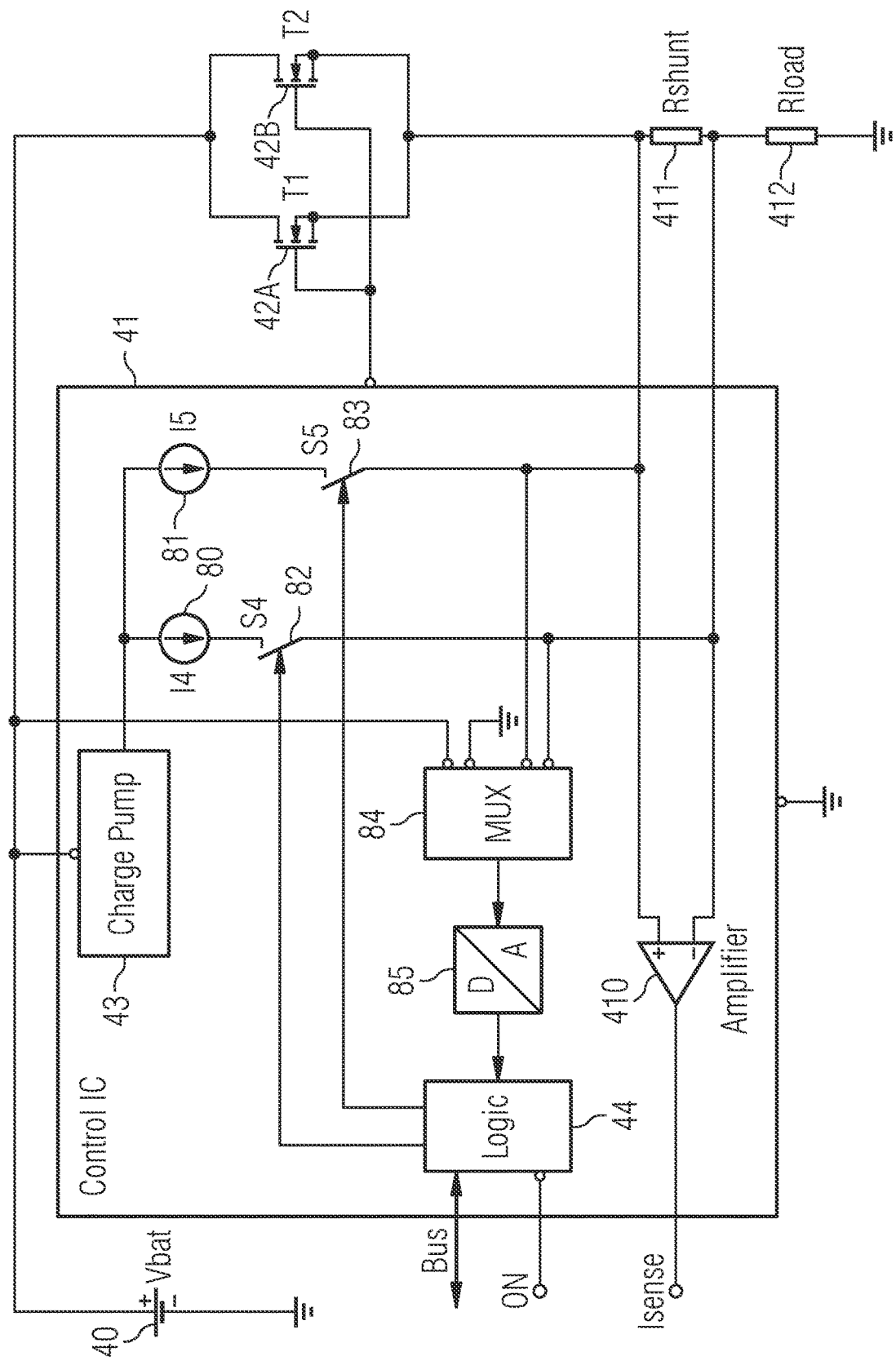
FIG. 8 is a circuit diagram illustrating a switch device according to an embodiment.

In FIG. 8, switches and currents for controlling the gates of transistors 42 (for example components 45-48 of FIGS. 4, 6 and 7) have been omitted to provide a clearer representation and are represented only by a connection of the gate terminals of transistors 42 to control circuit 41. In other words, while these components have been omitted in the representation of FIG. 8, they nevertheless may be provided.

In the embodiment of FIG. 8, by closing a switch 82, a current $I_4$ symbolized by a current source 80 may be provided to a first terminal of shunt resistor 411 also coupled to the negative input of amplifier 410, and by closing switch 83 a test current $I_5$ symbolized by a current source 81 may be provided to a second terminal of shunt resistor 411 coupled to a positive input of amplifier 410. Currents $I_4$, $I_5$ may be equal or different from each other. Currents $I_4$, $I_5$ are again examples for a small test current of FIG. 3 and are selected to be significantly smaller than currents flowing via transistors 42 to supply load 412, for example 10% or less or 1% of the load current to supply load 412. For example, currents $I_4$, $I_5$ may be in the miliampere range, while the load current may be several ampere or several tens of ampere. The first and second terminals of resistor 411 are coupled to an input of a multiplexer 84. An output of multiplexer 84 is coupled to a digital to analog converter 85. In this way, a digital representation of the voltage across shunt resistor 411 may be provided to logic 44 for evaluation. In other embodiments, the voltage $I_{sense}$ output by amplifier 410 may be evaluated in the testing described below.

The testing performed in FIG. 8 uses that shunt resistor 411 as explained above has a very low resistance value, for example in the µΩ range, and therefore almost corresponds to a short circuit between the first and second terminals of the shunt resistor. For testing, first switch 82 is closed, and the voltage across shunt resistor 411 is monitored. If the shunt resistor is connected correctly, this closing of switch 82 changes the voltage at both terminals of shunt resistor 411 in essentially the same manner (as it is almost a short circuit), and therefore, at least a small change of the voltage across shunt resistor 411 is detected by logic 44. In contrast, if the connection to one of the terminals of the shunt resistor is defective, only the first terminal is charged by current $I_4$ and therefore the voltage drop across shunt resistor 411 as seen by logic 44 changes. A similar test is then performed by closing switch 83. Also here, in case the shunt resistor is connected correctly essentially no change of the voltage across shunt resistor 411 is detected. Otherwise, a change of the voltage is detected. For example, the change in voltage may be compared to a threshold, and if the change exceeds the threshold, this may indicate a faulty connection of shunt resistor 411.

By using two switches 82, 83, a fault in a connection to shunt resistor 411 may be localized: if there is a fault in the connection to the terminal of shunt resistor 411 coupled to transistors 42 ("upper" terminal of FIG. 8), closing switch 83 leads to a change of the voltage across shunt resistor 411, while closing of switch 82 will essentially not change the voltage across shunt resistor 411. Conversely, if the fault is in the connection to the terminal of shunt resistor 411 coupled to load 412 ("lower" terminal of FIG. 8), closing switch 82 will change the voltage across shunt resistor 411, while closing switch 83 will leave the voltage essentially unchanged.

In this way, using a small test current and measuring the voltage across shunt resistor 411, faults in connection of the shunt may be detected.

A further measurement which may be made with the device of FIG. 8 is a measuring of the source voltage of transistors 42, which is an example for an implementation of determining a measure of the source voltage at 22 in FIG. 2. For this measurement, multiplexer 84 outputs the source voltage measured with respect to a reference voltage like ground $V_{bat1}$ (both connected to multiplexer 84 in FIG. 8) to digital to analog converter 85. Logic 44 may then evaluate the source voltage or may pass the source voltage to an external evaluation circuit via a bus. The source voltage gives information if transistors 42 are switched on. For example, when the transistors 42 of FIG. 8 are switched on, the source voltage should be essentially equal to voltage $V_{bat1}$. In contrast, if the transistors 42 are switched off, the source voltage should be at or near ground, depending on the implementation of load 412. Therefore, if the transistors are off and nevertheless the source voltage is at or near $V_{bat}$, this may indicate a short circuit of one or both of the transistors 42. Conversely, if the transistors are on according to the signal applied to their gates and the source voltage is near ground, this may indicate a fault of the transistors in that they do not switch to an on-state, as also in part discussed in the tables above with reference to FIG. 2.

Figure 9:
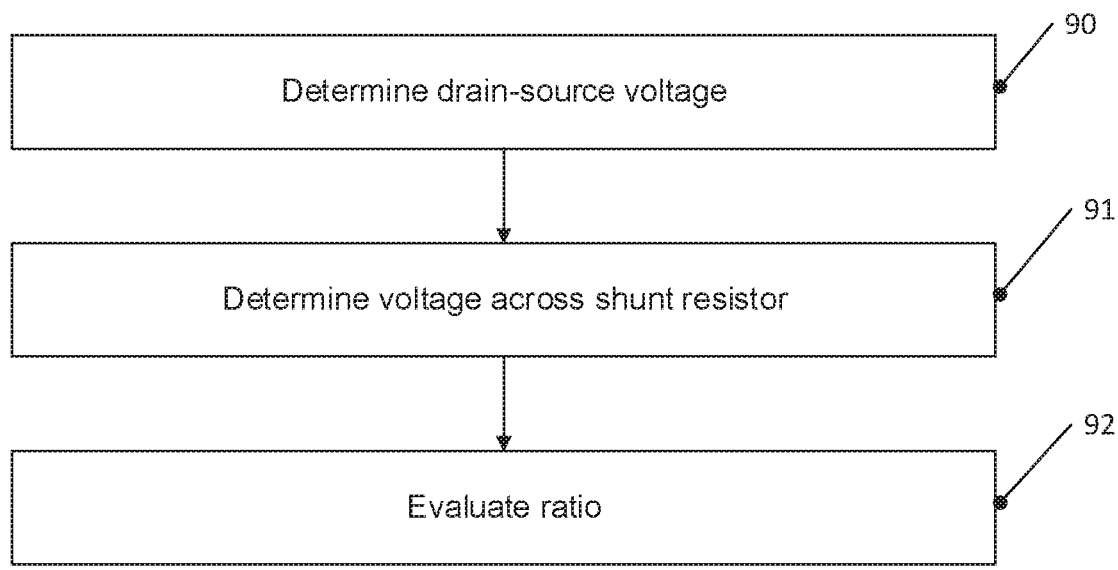
FIG. 9 is a flowchart illustrating a method according to an embodiment.

Next, determination of a measure of the drain-source voltage and a measure of shunt resistor voltage drop (21 and 25 in FIG. 2) will be explained referring to FIGS. 8 and 9. FIG. 9 illustrates a corresponding method according to an embodiment. At 90 in FIG. 9, the method comprises determining a drain-source voltage. This may be performed in FIG. 8 by multiplexer 84 providing the drain-source voltage to digital to analog converter 85, by using multiplexer inputs coupled to drain and source of transistors 42, respectively.

At 91, the method comprises determining a voltage across a shunt resistor like shunt resistor 411 of FIG. 8. In FIG. 8, this measurement of a voltage across the shunt may be done in the same manner as for the previously discussed testing if the shunt resistor is connected, i.e. by providing the voltage difference between the first and second terminals of shunt resistor 411 to digital to analog converter 85 to be evaluated as a digital value in logic 44 or externally via the bus.

At 92, the method in FIG. 9 determines evaluating a ratio between the drain-source voltage and the voltage across the shunt resistor. In an on-state of transistors 42, the drain-source voltage $V_{DS}$ is proportional to the voltage $V_{shunt}$ across shunt resistor 411 according to $V_{DS} = V_{shunt} \cdot R_{on}/R_{shunt}$, where $R_{on}$ is an on-resistance of transistors 42 and $R_{shunt}$ is the resistance of shunt resistor 411.

Therefore, the ratio $V_{DS}/V_{shunt}$ corresponds to the ratio $R_{on}/R_{shunt}$. For testing, in embodiments it is evaluated if this ratio between the drain-source voltage and the shunt voltage is in a predefined (for example programmable) range, for example corresponds to a predefined value. If the ratio $V_{DS}/V_{shunt}$ is outside the predefined range, this may indicate for example a short circuit between drain and source or one or more disconnected terminals of transistors 42.

Additionally or alternatively, the ratio between the source-drain voltage and the voltage across the shunt resistor may be monitored over time in some embodiments. A change, for example drift, of this ratio may indicate aging of transistors 42, when through the aging the on-resistance $R_{on}$ changes, in particular increases. Such an increase of $R_{on}$ may for example be caused by a degradation of a source metallization of one or both of transistors 42. When the ratio crosses a predefined value, this may indicate that the transistor should be replaced. In such a way, in some embodiments an early warning may be implemented such that transistors 42 may be exchanged before an actual fault occurs in some embodiments.

As already indicated in the above tables, in some embodiments, also an external short circuit may be detected. This is illustrated in FIG. 10.

Figure 10:
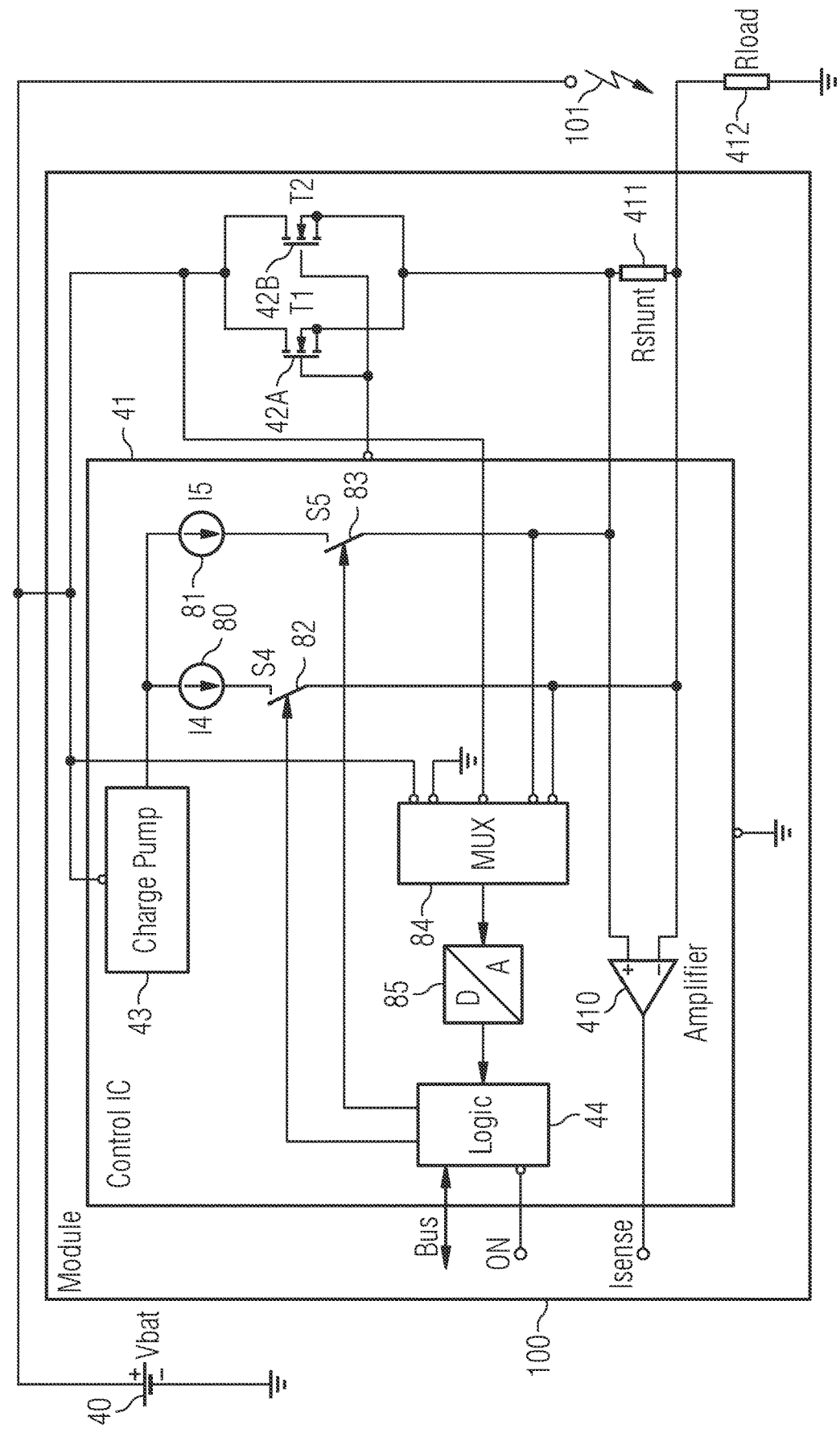
FIG. 10 is a circuit diagram illustrating a switch device according to an embodiment.

In the embodiment of FIG. 10, circuit 41, shunt resistor 411 and transistors 42 are arranged on a module 100. Load 412 and voltage supply 40 are external to module 100. In FIG. 10, an arrow 101 indicates an external short circuit from voltage supply 40 to load 412, i.e. a short circuit outside module 100. In case of such an external short circuit, essentially no current flows via shunt resistor 411 and transistors 42, and the voltage across shunt resistor 411 and the drain-source voltage are at or close to zero. On the other hand, if a short circuit occurs on board (for example across shunt resistor 411 or across transistors 42), at least the drain-source voltage in case of a short circuit across shunt resistor 411 or the voltage across shunt resistor 411 in case of a short circuit of transistors 42 is different from zero. Therefore, in this way, an external short circuit external to board 100 may be distinguished from a short circuit on module 100.

Therefore, with embodiments discussed herein, test measurements may be performed to determine and distinguish various fault states in a MOS transistor switch device. As already mentioned, while a plurality of different test measurements has been discussed, other embodiments may only implement some or one of these measurements. Therefore, it is evident that the above-described embodiments are not to be construed as limiting.

At least some embodiments are defined by the examples given below:

Example 1

A method, comprising: performing at least two test measurements on a switch device, the switch device comprising at least one switch transistor, wherein the at least two test measurements are selected from the group consisting of:
  determining a measure of a gate capacitance of the at least one switch transistor,
  determining a measure of a drain-source voltage of the at least one switch transistor, determining a measure of a source voltage of the at least one switch transistor, testing a shunt resistor of the switch device, and determining a measure of a voltage drop across the shunt resistor, and determining a fault state of the transistor switch device based on the at least two test measurements.

Example 2

The method of example 1, wherein the method comprises performing the at least two test measurements during normal operation of the switch device.

Example 3

The method of example 1 or 2, wherein determining a fault state comprises determining that a terminal of the at least one switch transistor is disconnected when the measure of the gate impedance indicates that the gate impedance is above a first predefined value.

Example 4

The method of example 3, wherein the determining that a terminal is disconnected comprises detecting that the terminal is disconnected if in an on-state of the at least one switch transistor the measure of the drain-source voltage and the measure of the voltage across the shunt transistor indicate that a ratio of the drain-source voltage to the source voltage across the shunt resistor is above a second predefined value.

Example 5

The method of any one of examples 1-4, wherein determining a fault state comprises determining that a gate short circuit is present if the measure of the gate impedance indicates that the gate impedance is below a third predefined value.

Example 6

The method of example 5, wherein the gate short circuit is determined to be present if the measure of the source voltage indicates that the source voltage is above a fourth predefined value.

Example 7

The method of any one of examples 1-6, wherein determining the fault state comprises determining a drain-source short circuit is present if the measure of the drain-source voltage and the measure of the shunt voltage indicate that a ratio of the drain-source voltage to the voltage across the shunt resistor is below a fifth predefined value.

Example 8

The method of example 7, wherein the drain-source circuit is determined to be present if, in an off-state of the at least one switch transistor, the measure of the source voltage indicates that the source voltage is above a sixth predefined value.

Example 9

The method of any one of examples 1-8, wherein determining a fault state comprises determining one of an open shunt and disconnected shunt terminals based on the testing of the shunt resistor.

Example 10

The method of any one of examples 1-9, wherein determining a fault state comprises determining a short circuit of the shunt resistor is present if the measure of the drain-source voltage and the measure of the voltage across the shunt resistor indicate that a ratio of the drain-source voltage to the voltage across the shunt resistor is above a seventh predefined value, and the measure of the gate impedance indicates that the gate impedance is essentially in an expected range.

Example 11

The method of any one of examples 1-10, wherein determining a fault state comprises determining an open shunt resistor if, in an on-state of the at least one switch transistor, the measure of the voltage across the shunt resistor indicates that the voltage across the shunt resistor is essentially equal to a supply voltage provided to the switch transistor device.

Example 12

The method of any one of examples 1-11, wherein determining a fault state comprises determining that a gate charging circuit is defective if, in an off-state of the at least one switch transistor, the measure of the gate impedance indicates that the gate impedance is below an eighth predefined value, and the measure of the source voltage indicates that the source voltage is essentially at an expected value.

Example 13

The method of any one of examples 1-12, wherein determining a fault state comprises determining a short circuit outside a module, the module comprising circuitry for performing the at least two test measurements, the at least one switch transistor and the shunt resistor, based on a measure of the source voltage indicating that the source voltage is above a ninth predefined value and based on at least one of the measure of the voltage across the shunt resistor and the measure of the drain-source voltage.

Example 14

The method of any one of examples 1-13, wherein the at least one switch transistor comprises at least two switch transistors coupled in parallel, and wherein determining a fault state comprises distinguishing between one or more gate terminals of the at least two switch transistors being disconnected based on the measure of the gate capacitance.

Example 15

A method, comprising:
applying a test current to a switch device comprising at least one switch transistor, the test current having a magnitude selected essentially not to disturb normal operation of the switch device, measuring a voltage in response to the test current, and determining a fault state of the switch device based on the measured voltage.

Example 16

The method of example 15, wherein applying the test current comprises applying the test current to a gate terminal of the at least one switch transistor, wherein the magnitude of the test current is selected such that a switch state of the switch transistor does not change in response to the test current, and wherein measuring the voltage comprises measuring a gate-source voltage of the at least one switch transistor.

Example 17

The method of example 16, wherein applying the test current comprises applying a constant test current to at least one of charge or discharge the gate terminal of the at least one transistor, wherein determining the fault state is based on at least one of
- a time the test current flows until the gate-source voltage reaches a predefined voltage range,
- a slope of the gate-source voltage while the test current is applied, and
- a gate-source voltage reached when the test current is applied for a predefined time.

Example 18

The method of example 17, wherein determining the fault state comprises determining at least one of one or more gate terminals of the at least one switch transistor being disconnected, or a circuit generating the test current being defective.

Example 19

The method of example 16, wherein the test current is an alternating current, and wherein detecting the fault state is based on an amplitude of the gate-source voltage in response to the test current.

Example 20

The method of any one of examples 15-19, wherein applying the test current comprises applying a test current selectively to a first terminal or a second terminal of a shunt resistor coupled to the at least one switch transistor, wherein measuring the voltage comprises measuring a voltage across the shunt resistor.

Example 21

The method of example 20, wherein the test current is smaller than 10% of a load current when the at least one switch transistor is turned on.

Example 22

The method of example 20 or 21, wherein detecting the fault state comprises a detection of a fault state associated with the shunt resistor based on the voltage across the shunt resistor.

Example 23

A method, comprising:
determining a drain-source voltage of at least one switch transistor,
determining a voltage across a shunt resistor coupled to the at least one switch transistor, and
evaluating a ratio between the drain-source voltage and the voltage across the shunt resistor.

Example 24

The method of example 23, wherein evaluating the ratio comprises determining a fault state associated with the switch transistor if the ratio deviates from an expected range.

Example 25

The method of example 23 or 24, wherein evaluating the ratio comprises monitoring the ratio over time to detect an aging of the at least one switch transistor.

Example 26

A device, comprising:
a test current generator configured to apply a test current to a switch device comprising at least one switch transistor, the test current having a magnitude selected essentially not to disturb normal operation of the switch device,
a voltage measurement circuit configured to measure a voltage in response to the test current, and
an evaluation circuit configured to determine a fault state of the switch device based on the measured voltage.

Example 27

The device of example 26, wherein the test current generator comprises a gate charging/discharging circuit configured to charge/discharge a gate terminal of the at least one switch transistor, wherein the magnitude of the test current is selected such that a switch state of the switch transistor does not change in response to the test current, and wherein the voltage measurement circuit is configured to measure a gate-source voltage of the at least one switch transistor.

Example 28

The device of example 27, wherein the gate charging/discharging circuit is configured to apply a constant test current to at least one of charge or discharge the gate terminal of the at least one switch transistor, wherein the evaluation circuit is configured to determine the fault state is based on at least one of
- a time the test current flows until the gate-source voltage reaches a predefined voltage range,
- a slope of the gate-source voltage while the test current is applied, and
- a gate-source voltage reached when the test current is applied for a predefined time.

Example 29

The device of example 27 or 28, wherein the voltage measurement circuit comprises at least one of a window comparator or an analog to digital converter.

Example 30

The device of any one of examples 27-29, wherein the gate charging/discharging circuit is configured to generate the test current as an alternating current, and wherein the voltage measurement circuit is configured to measure an amplitude of the gate-source voltage in response to the test current.

Example 31

The device of any one of examples 26-30, wherein the test current generator is configured to apply the test current selectively to a first terminal or a second terminal of a shunt resistor coupled to the at least one switch transistor, wherein the voltage measurement circuit is configured to measure a voltage across the shunt resistor.

Example 32

The device of example 31, wherein the test current is smaller than 10% of a load current when the at least one switch transistor is turned on.

Example 33

A device, comprising:
a measurement circuit configured to determine a drain-source voltage of at least one switch transistor, and to determine a voltage across a shunt resistor coupled to the at least one switch transistor, and
an evaluation circuit configured to evaluate a ratio between the drain-source voltage and the voltage across the shunt resistor.

Example 34

The device of example 33, wherein the evaluation circuit is configured to determine a fault state associated with the switch transistor if the ratio deviates from an expected range.

Example 35

The device of example 33 or 34, wherein the evaluation circuit is configured to monitor the ratio over time to detect an aging of the at least one switch transistor.

Example 36

The device of any one of examples 33-35,
wherein the measurement circuit comprises a multiplexer and a digital to analog converter, wherein the multiplexer is configured to selectively provide the drain-source voltage or the voltage across the shunt resistor to the digital to analog converter.

What is claimed is:

1. A method, comprising:
performing at least two test measurements on a switch device during normal operation of the switch device such that a switch state of the switching device is not altered when performing the at least two measurements on the switch device, the switch device comprising at least one switch transistor,
wherein the at least two test measurements include:
determining a measure of a gate capacitance of the at least one switch transistor,
determining a measure of a drain-source voltage of the at least one switch transistor, and
determining a measure of a source voltage of the at least one switch transistor, and wherein the at least two measurements further include one or more of:
testing a shunt resistor of the switch device, and
determining a measure of a voltage drop across the shunt resistor, and
determining a fault state of the transistor switch device based on the at least two test measurements.

2. The method of claim 1, wherein determining a fault state comprises determining that a terminal of the at least one switch transistor is disconnected when the measure of the gate capacitance indicates that a gate impedance of the at least one switch transistor is above a first predefined value.

3. The method of claim 2, wherein the determining that a terminal is disconnected comprises detecting that the terminal is disconnected if in an on-state of the at least one switch transistor the measure of the drain-source voltage and the measure of the voltage across the shunt transistor indicate that a ratio of the drain-source voltage to the source voltage across the shunt resistor is above a second predefined value.

4. The method of claim 1, wherein determining a fault state comprises determining that a gate short circuit is present if the measure of the gate capacitance indicates that a gate impedance of the at least one switch transistor is below a third predefined value.

5. The method of claim 4, wherein the gate short circuit is determined to be present if the measure of the source voltage indicates that the source voltage is above a fourth predefined value.

6. The method of claim 1, wherein determining the fault state comprises determining a drain-source short circuit is present if the measure of the drain-source voltage and the measure of the shunt voltage indicate that a ratio of the drain-source voltage to the voltage across the shunt resistor is below a fifth predefined value.

7. The method of claim 6, wherein the drain-source circuit is determined to be present if, in an off-state of the at least one switch transistor, the measure of the source voltage indicates that the source voltage is above a sixth predefined value.

8. The method of claim 1, wherein determining a fault state comprises determining one of an open shunt and disconnected shunt terminals based on the testing of the shunt resistor.

9. The method of claim 1, wherein determining a fault state comprises determining a short circuit of the shunt resistor is present if the measure of the drain-source voltage and the measure of the voltage across the shunt resistor indicate that a ratio of the drain-source voltage to the voltage across the shunt resistor is above a seventh predefined value, and the measure of the gate capacitance indicates that a gate impedance of the at least one switch transistor is essentially in an expected range.

10. The method of claim 1, wherein determining a fault state comprises determining an open shunt resistor if, in an on-state of the at least one switch transistor, the measure of the voltage across the shunt resistor indicates that the voltage across the shunt resistor is essentially equal to a supply voltage provided to the switch transistor device.

11. The method of claim 1, wherein determining a fault state comprises determining that a gate charging circuit is defective if, in an off-state of the at least one switch transistor, the measure of the gate capacitance indicates that a gate impedance of the at least one switch transistor is below an eighth predefined value, and the measure of the source voltage indicates that the source voltage is essentially at an expected value.

12. The method of claim 1, wherein determining a fault state comprises determining a short circuit outside a module, the module comprising circuitry for performing the at least two test measurements, the at least one switch transistor and the shunt resistor, based on a measure of the source voltage indicating that the source voltage is above a ninth predefined value and based on at least one of the measure of the voltage across the shunt resistor and the measure of the drain-source voltage.

13. The method of claim 1, wherein the at least one switch transistor comprises at least two switch transistors coupled in parallel, and wherein determining a fault state comprises distinguishing between one or more gate terminals of the at least two switch transistors being disconnected based on the measure of the gate capacitance.

14. A device comprising a test circuit, the test circuit configured to:

perform at least two test measurements on a switch transistor of a switch device during normal operation of the switch device such that a switch state of the switch transistor is not altered when performing the at least two measurements on the switch transistor, wherein the at least two test measurements include:

determining a measure of a gate capacitance of the switch transistor, determining a measure of a drain-source voltage across the switch transistor, and determining a measure of a source voltage of the switch transistor, and wherein the at least two measurements further include one or more of:

testing a shunt resistor of the switch device, and determining a measure of a voltage drop across the shunt resistor, and determine a fault state of the switch device based on the at least two test measurements.

* * * * *